US012666649B2

(12) United States Patent
Kim et al.

(10) Patent No.: US 12,666,649 B2
(45) Date of Patent: Jun. 23, 2026

(54) SEMICONDUCTOR DEVICE INCLUDING GATE STRUCTURE AND MULTIPLE INTEGRATED SEPARATION STRUCTURES

(71) Applicant: SAMSUNG ELECTRONICS CO., LTD., Suwon-si (KR)

(72) Inventors: Jeewoong Kim, Suwon-si (KR); Jisu Kang, Suwon-si (KR); Hojun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 500 days.

(21) Appl. No.: 18/296,209

(22) Filed: Apr. 5, 2023

(65) Prior Publication Data

US 2024/0079467 A1     Mar. 7, 2024

(30) Foreign Application Priority Data

Sep. 6, 2022     (KR) ........................ 10-2022-0112620

(51) Int. Cl.
H10D 30/67          (2025.01)
H10D 30/01          (2025.01)
          (Continued)

(52) U.S. Cl.
CPC ....... H10D 30/6735 (2025.01); H10D 30/021 (2025.01); H10D 30/024 (2025.01);
          (Continued)

(58) Field of Classification Search
CPC .......... H10D 30/6735; H10D 30/6757; H10D 30/43; H10D 30/021; H10D 30/024;
          (Continued)

(56) References Cited

U.S. PATENT DOCUMENTS 11,087,831 B2     8/2021   Liaw
11,145,752 B2     10/2021  Feng et al.
          (Continued)

FOREIGN PATENT DOCUMENTS

CN          114496916          5/2022
DE        102020131140        2/2022
          (Continued)

OTHER PUBLICATIONS

Extended Search Report dated Feb. 8, 2024 in corresponding European Patent Application Serial No. 23173455.9, 12 pages.

*Primary Examiner* — Davienne N Monbleau
*Assistant Examiner* — Heim Kirin Grewal
(74) *Attorney, Agent, or Firm* — Morgan, Lewis & Bockius LLP

(57)          ABSTRACT

A semiconductor device includes active regions, including a first active region and a second active region, extending in a first horizontal direction, an isolation region defining the active regions, a gate structure disposed on the isolation region and extending in a second horizontal direction to intersect the active region, and separation structures penetrating through the gate structure and disposed on the isolation region between the first active region and the second active region. The separation structures include a first separation structure extending into the isolation region, and a second separation structure disposed on the first separation structure and penetrating through at least a portion of the first separation structure, and a width of a lower region of the second separation structure in the second horizontal direction is less than a width of an upper region of the first separation structure in the second horizontal direction.

16 Claims, 16 Drawing Sheets

100e

(51) Int. Cl.

| | |
|---|---|
| *H10D 30/43* | (2025.01) |
| *H10D 62/10* | (2025.01) |
| *H10D 62/17* | (2025.01) |
| *H10D 64/01* | (2025.01) |
| *H10D 84/01* | (2026.01) |

(52) U.S. Cl.

CPC ......... *H10D 30/43* (2025.01); *H10D 30/6757* (2025.01); *H10D 62/121* (2025.01); *H10D 64/017* (2025.01); *H10D 62/364* (2025.01); *H10D 84/0135* (2025.01); *H10D 84/0151* (2025.01)

(58) Field of Classification Search

CPC ........... H10D 84/0151; H10D 84/0135; H10D 64/017; H10D 62/364; H10D 62/121; H10D 30/501–509; H10D 30/674

See application file for complete search history.

(56) References Cited

U.S. PATENT DOCUMENTS

| | | | |
|---|---|---|---|
| 11,264,380 B2 | 3/2022 | Li et al. | |
| 2017/0154966 A1 | 6/2017 | Huang et al. | |
| 2019/0027575 A1 | 1/2019 | Zang et al. | |
| 2019/0067277 A1 | 2/2019 | Tsai et al. | |
| 2019/0109197 A1 | 4/2019 | Wang et al. | |
| 2019/0164741 A1 | 5/2019 | Wen et al. | |
| 2020/0006075 A1 | 1/2020 | Wang et al. | |
| 2020/0083222 A1* | 3/2020 | Kim | H10D 84/0193 |
| 2020/0135574 A1 | 4/2020 | Yang et al. | |
| 2020/0135848 A1 | 4/2020 | Lim et al. | |
| 2020/0168509 A1 | 5/2020 | Zang et al. | |
| 2021/0074842 A1 | 3/2021 | Shu | |
| 2021/0159311 A1* | 5/2021 | Lan | H10D 84/0158 |
| 2021/0265508 A1* | 8/2021 | Chiang | H10D 30/014 |
| 2022/0020742 A1* | 1/2022 | You | H10D 84/0142 |
| 2022/0045051 A1 | 2/2022 | You et al. | |
| 2022/0068720 A1 | 3/2022 | Jang et al. | |
| 2022/0173213 A1 | 6/2022 | Lan et al. | |
| 2023/0245930 A1* | 8/2023 | Chiang | H10D 30/6757 |
| | | | 257/369 |

FOREIGN PATENT DOCUMENTS

| | | | |
|---|---|---|---|
| EP | 3961723 A1 | 3/2022 | |
| EP | 4202995 A1 | 6/2023 | |

* cited by examiner

100b

100c

100d

100e

SEMICONDUCTOR DEVICE INCLUDING GATE STRUCTURE AND MULTIPLE INTEGRATED SEPARATION STRUCTURES

CROSS-REFERENCE TO RELATED APPLICATION

This U.S. non-provisional patent application claims priority under 35 U.S.C. § 119 to Korean Patent Application No. 10-2022-0112620, filed on Sep. 6, 2022, in the Korean Intellectual Property Office, the disclosure of which is incorporated by reference herein in its entirety.

TECHNICAL FIELD

Exemplary embodiments of the present inventive concept relate to a semiconductor device. More specifically, embodiments of the present inventive concept relate to a semiconductor device including a gate structure and a separation structure and a method of fabricating the same.

DISCUSSION OF RELATED ART

In order to increase price competitiveness of products, there is a growing demand for an increase in degrees of integration of semiconductor devices. Semiconductor devices have been scaled down to increase degrees of integration thereof. As integration of semiconductor devices increase, dimensions of gate electrodes/lines of semiconductor devices become less and distances between gate electrodes/lines decrease gradually.

SUMMARY

Exemplary embodiments of the present inventive concept provide a semiconductor device having an increased degree of integration. Exemplary embodiments of the present inventive concept provide a semiconductor device including a separation structure for electrically separating gate structures from each other. Exemplary embodiments of the present inventive concept provide a method of fabricating a semiconductor device including a separation structure for electrically separating gate structures from each other.

According to an exemplary embodiment of the present inventive concept, a semiconductor device includes: active regions, including a first active region and a second active region parallel to each other, disposed on a substrate and extends in a first horizontal direction; an isolation region defining the active regions; a gate structure disposed on the isolation region and extending in a second horizontal direction to intersect an active region; and separation structures penetrating through the gate structure and disposed on the isolation region between the first active region and the second active region. The separation structures include a first separation structure extending into the isolation region, and a second separation structure disposed on the first separation structure and penetrating through at least a portion of the first separation structure, and where a width of a lower region of the second separation structure in the second horizontal direction is less than a width of an upper region of the first separation structure in the second horizontal direction.

According to an exemplary embodiment of the present inventive concept, a semiconductor device includes: active regions, including a first active region and a second active region parallel to each other, disposed on a substrate and extends in a first horizontal direction; an isolation region between the first active region and the second active region; a first gate structure intersecting the first active region, extending in a second horizontal direction perpendicular to the first horizontal direction, and having a first end portion disposed on the isolation region; a second gate structure intersecting the second active region, extending in the second horizontal direction, and having a second end portion opposite from the first end portion of the first gate structure disposed on the isolation region; a first separation structure vertically penetrating through at least a portion of the isolation region; and a second separation structure disposed between the first end portion of the first gate structure and the second end portion of the second gate structure and contacting the first separation structure. The first gate structure includes a first gate dielectric layer and a first gate electrode disposed on the first gate dielectric layer, where the second gate structure includes a second gate dielectric layer and a second gate electrode disposed on the second gate dielectric layer. A maximum width of the second separation structure in the second horizontal direction is less than a minimum width of the first separation structure in the second horizontal direction, where the first separation structure is spaced apart from the first gate electrode and the second gate electrode, and where the second separation structure contacts the first gate electrode and the second gate electrode.

According to an exemplary embodiment of the present inventive concept, a semiconductor device includes: active regions, including a first active region and a second active region parallel to each other, disposed on a substrate and extends in a first horizontal direction; an isolation region between the first active region and the second active region; a first separation structure vertically penetrating through at least a portion of the isolation region; first channel layers spaced apart from each other in a vertical direction, perpendicular to an upper surface of the substrate, disposed on the first active region; second channel layers spaced apart from each other in the vertical direction disposed on the second active region; a first gate structure intersecting the first active region and the first channel layers, surrounding each of the first channel layers, extending in a second horizontal direction perpendicular to the first horizontal direction, and having a first end portion disposed on an upper surface of the first separation structure; and a second gate structure intersecting the second active region and the second channel layers, surrounding each of the second channel layers, extending in the second horizontal direction, and having a second end portion disposed on an upper surface of the first separation structure. The first gate structure includes a first gate dielectric layer and a first gate electrode disposed on the first gate dielectric layer, and where the second gate structure includes a second gate dielectric layer and a second gate electrode disposed on the second gate dielectric layer.

DETAILED DESCRIPTION

Figure 1:
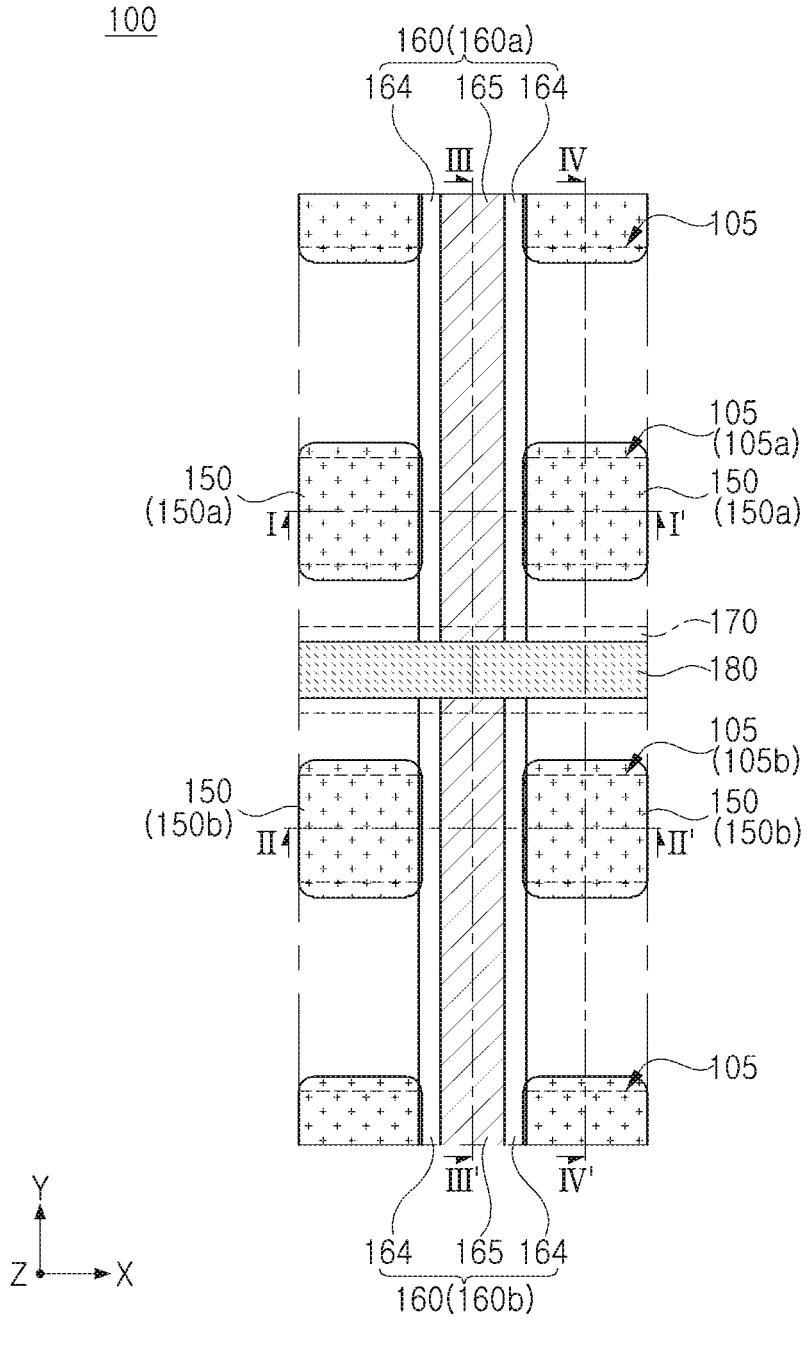
FIG. 1 is a plan view illustrating a semiconductor device according to exemplary embodiments.

Hereinafter, exemplary embodiments will be described with reference to the accompanying drawings. Identical reference numerals are used for the same constituent elements in the drawings, and duplicate descriptions thereof may be omitted.

Hereinafter, exemplary embodiments will be described with reference to the accompanying drawings. In the descriptions below, terms "upper," "upper portion," "upper surface," "lower," "lower portion," "lower surface," "side surface," and the like, are used with reference to the diagrams unless otherwise indicated.

Figure 2A:
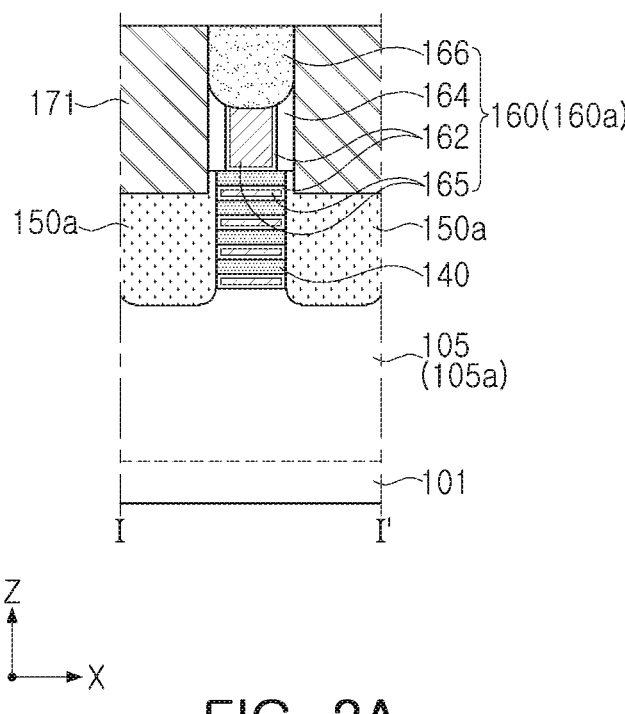
FIGS. 2A, 2B and 2C are cross-sectional views illustrating a semiconductor device according to exemplary embodiments.
Figure 2B:
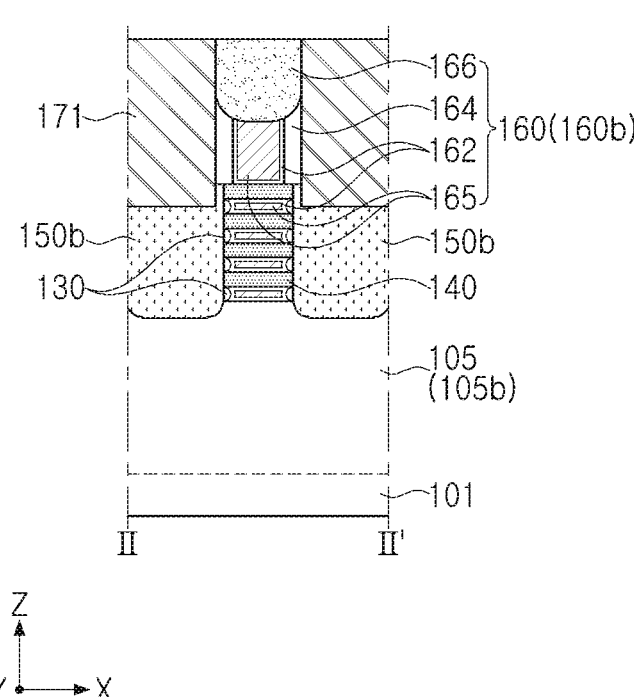
Figure 2C:
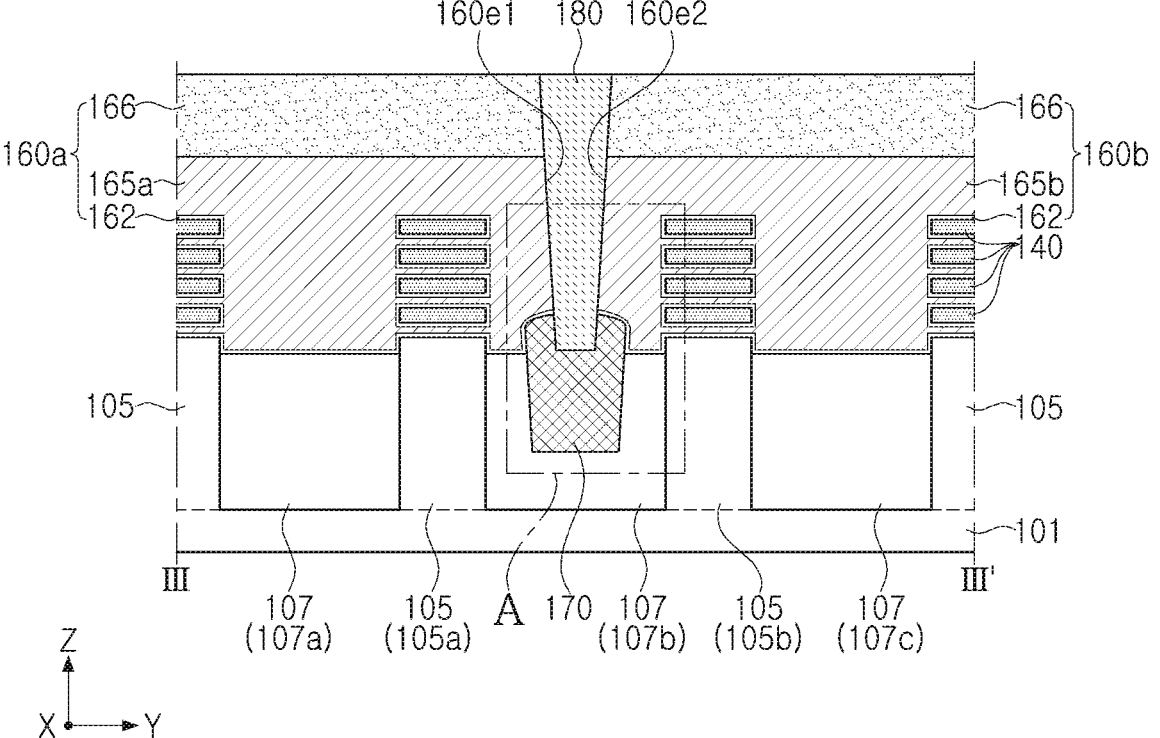
Figure 2D:
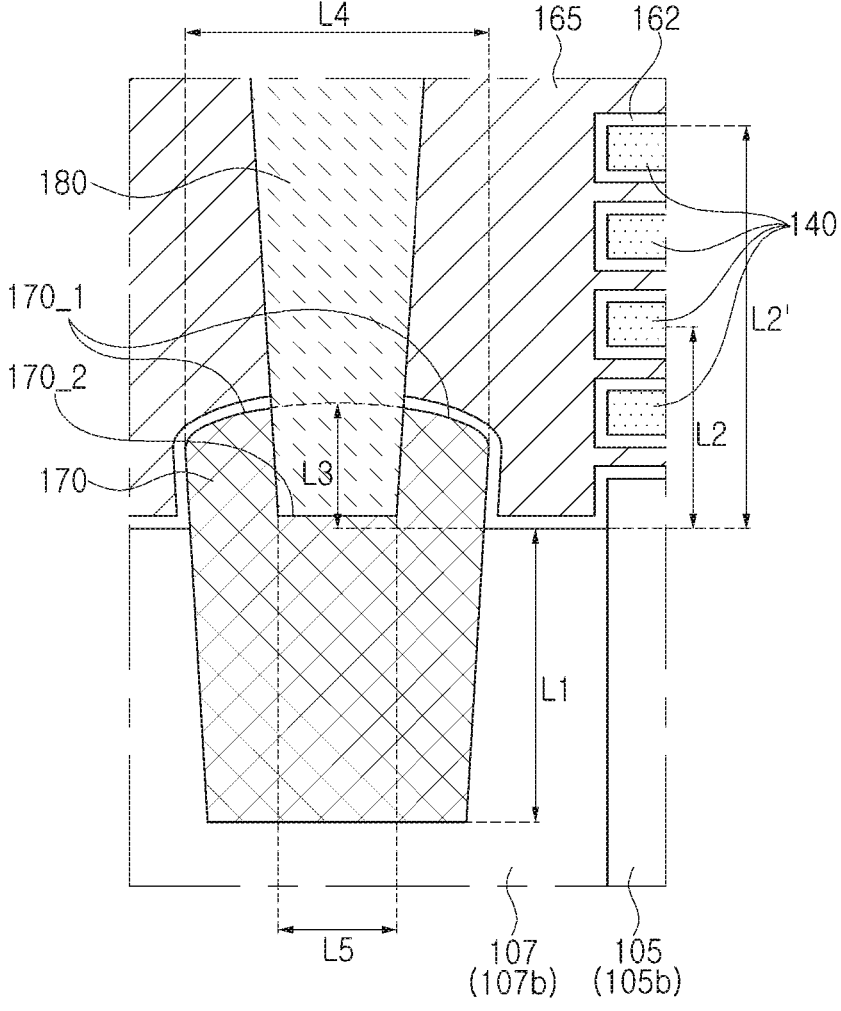
FIG. 2D is a partially enlarged view illustrating a portion of a semiconductor device according to exemplary embodiments.
Figure 2E:
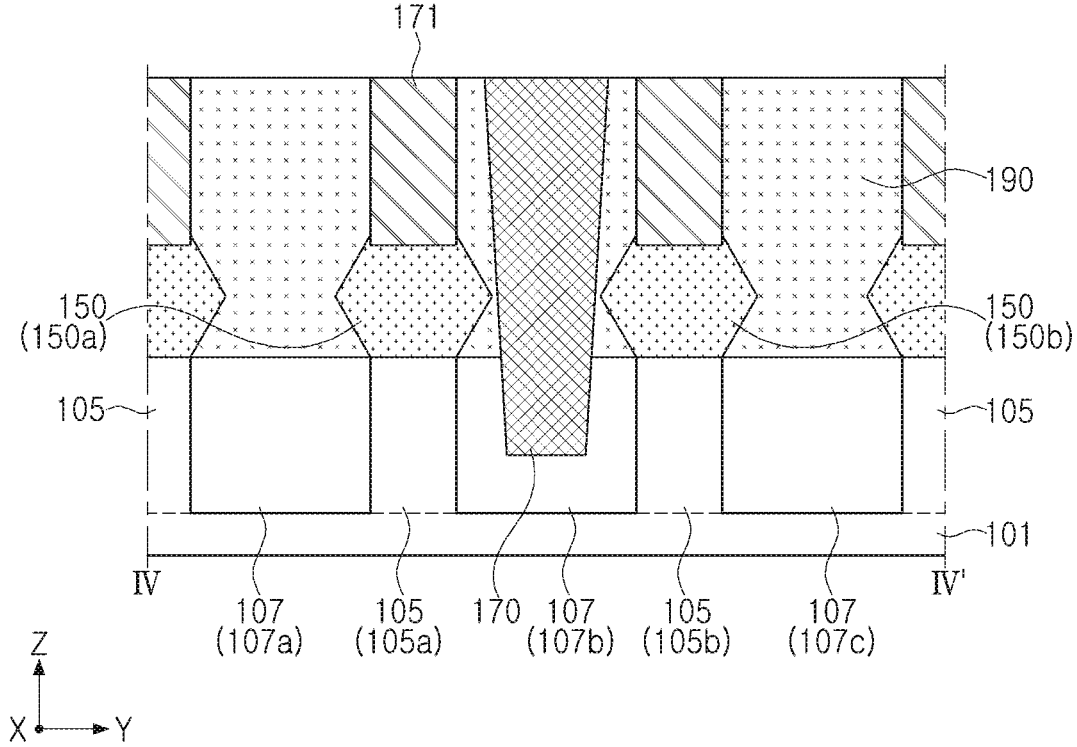
FIG. 2E is a cross-sectional view illustrating a semiconductor device according to exemplary embodiments.

FIG. 1 is a plan view illustrating a semiconductor device according to exemplary embodiments. FIGS. 2A to 2C are cross-sectional views illustrating a semiconductor device according to exemplary embodiments. FIG. 2D is a partially enlarged view illustrating a portion of a semiconductor device according to exemplary embodiments. FIG. 2E is a cross-sectional view illustrating a semiconductor device according to exemplary embodiments.

FIGS. 2A, 2B, and 2C are cross-sectional views taken along lines I-I', II-IT, and III-III' of FIG. 1, respectively. FIG. 2D is a partially enlarged view of region "A" of FIG. 2C. FIG. 2E is a cross-sectional view taken along line IV-IV' of FIG. 1.

Referring to FIGS. 1 to 2E, a semiconductor device 100 may include a substrate 101, active regions 105 on the substrate 101, an isolation region 107 isolating the active regions 105 from each other, channel layers 140 disposed on the active regions 105, source/drain regions 150 contacting the channel layers 140, gate structures 160 extending in a Y-direction and intersecting the active regions 105, contact plugs 171, first separation structure 170 and second separation structure 180, and an interlayer insulating layer 190. The isolation regions 107 may define the active regions 105. The gate structures 160 may include a gate dielectric layer 162, a gate electrode 165, a gate spacer 164, and a gate capping layer 166.

In an embodiment, the channel layers 140 may be vertically spaced apart (in a Z-direction) from each other on the active regions 105. According to the embodiment, the active regions 105 may have a fin structure, and the gate electrode 165 may be disposed between the active regions 105 and a lowermost channel layer of the channel layers 140, disposed between each of the channel layers 140, and disposed on an uppermost channel layer of the channel layers 140. Accordingly, the semiconductor device 100 may include a transistor having a multi-bridge channel FET (MBCFET™) structure, a gate-all-around type field effect transistor formed by the channel layers 140, the source/drain regions 150, and the gate structures 160.

The substrate 101 may have an upper surface extending in an X-direction and a Y-direction. The substrate 101 may include a semiconductor material such as a Group IV semiconductor, a Group III-V compound semiconductor, or a Group II-VI compound semiconductor. For example, the group IV semiconductor may include silicon, germanium, or silicon-germanium. For example, the Group III-V compound semiconductor may refer to an alloy containing elements from group III and group V in the period table. The substrate 101 may be provided as a bulk wafer, an epitaxial layer, a silicon-on-insulator (SOI) layer, or a Semiconductor-on insulator (SeOI) layer.

The active regions 105 may be disposed to extend in a direction parallel to an upper surface of the substrate 101, for example, in the X-direction. The active regions 105 may be spaced apart from each other in the Y-direction, and may be disposed to be parallel to each other. The active regions 105 may protrude from the upper surface of the substrate 101 in a vertical direction Z. Upper ends of the active regions 105 may be disposed to protrude from upper ends of the isolation regions 107 to a predetermined height. For example, a level of the upper ends of the active regions 105 may be higher than the upper ends of the isolation regions 107. The active regions 105 may be formed as a portion of the substrate 101, or may include an epitaxial layer grown from the substrate 101. However, the active regions 105 on the substrate 101 may be partially recessed on opposite sides that are adjacent to the gate structures 160, and source/drain regions 150 may be disposed on the recessed active regions 105.

In an embodiment, the active regions 105 may include a first active region 105a and a second active region 105b adjacent to each other. Each of the first active region 105a and the second active region 105b may have a line shape or a bar shape extending in the X-direction. The first active region 105a and the second active region 105b may be spaced apart from each other and may extend in parallel to each other, but exemplary embodiments are not limited thereto. The first active region 105a and the second active region 105b may have different conductivity types. When the first active region 105a has a first conductivity type, the second active region 105b may have a second conductivity type, where the second conductivity type is different from the first conductivity type. In some cases, the first conductivity type may be a P-type conductivity, and the second conductivity type may be an N-type conductivity.

The isolation regions 107 may define active regions 105 in the substrate 101. For example, the isolation region 107 may be disposed between active regions 105. For example, the isolation region 107 may be disposed between the first active region 105a and the second active region 105b as shown in FIG. 2C. The isolation region 107 may have an upper end on a level that is lower than a level of upper ends of the active regions 105. Accordingly, the isolation region 107 may partially expose upper portions of the active regions 105. In an embodiment, the isolation region 107 may have a curved upper surface having a level increased in a direction toward the active regions 105, but exemplary embodiments are not limited thereto. The isolation region 107 may be formed by, for example, a shallow trench isolation (STI) process. The isolation region 107 may be formed using an insulating material. The isolation region 107 may include, for example, an oxide, a nitride, or a combination thereof.

In an embodiment, the isolation region 107 may include first isolation region 107a, second isolation region 107b, and third isolation region 107c spaced apart from each other by first active region 105a and second active region 105b. For example, the first active region 105a may have an upper end protruding in the Z-direction and disposed between the first isolation region 107a and second isolation region 107b, and the second active region 105b may have an upper end protruding in the Z-direction and disposed between the second isolation region 107b and third isolation region 107c.

The channel layers 140 may be spaced apart from each other in the Z-direction, perpendicular to the upper surface of the substrate 101, on the active regions 105. The channel layers 140 may be connected to the source/drain regions 150, and may be spaced apart from upper surfaces of the active regions 105. The channel layers 140 may include first channel layers 140, spaced apart from each other in the vertical direction Z, perpendicular to the upper surface of the substrate 101, on the first active region 105a, and second channel layers 140 spaced apart from each other in the vertical direction Z on the second active region 105b. A width of each of the channel layers 140 may be the same as or similar to a width of each of the active regions 105 in the Y-direction. A width of each of the channel layers 140 may be the same as or similar to a width of each of the gate structures 160 in the X-direction. However, according to some embodiments, the channel layers 140 may have a width smaller than the width of each of the gate structures 160 such that side surfaces thereof are disposed below the gate structures 160 in the X-direction. According to some embodiments, the channel layers 140 include four channel layers, however, the number of channel layers is not limited thereto and may vary according to exemplary embodiments. The channel layers 140 may be formed of a semiconductor material and may include at least one of, for example, silicon (Si), silicon-germanium (SiGe), or germanium (Ge). In some cases each of the channel layers 140 may include the same material, but may include different materials according to exemplary embodiments.

The source/drain regions 150 may be disposed on the active regions 105 adjacent to at least one side of the channel layers 140. The source/drain regions 150 may be disposed to cover a side surface of each of the channel layers 140. The lower ends of the source/drain regions 150 may cover the upper surfaces of the active regions 105. The source/drain regions 150 may be in contact with the channel layers 140. The source/drain regions 150 may be disposed by partially recessing upper portions of the active regions 105, but the presence of a recess and the depth of the recess may vary according to some embodiments. The source/drain regions 150 may be a semiconductor layer including silicon (Si) or may include an epitaxial layer.

A level of the upper surfaces of the source/drain regions 150 may be the same as or similar to a level of lower surfaces of the uppermost gate structure of the gate structures 160 on the channel layers 140. However, the level of the upper surfaces of the source/drain regions 150 may vary according to some embodiments. Each of the source/drain regions 150 may have a polygonal shape on a cross-section in the Y-direction, as illustrated in FIG. 2E. However, exemplary embodiments are not limited thereto and each of the source/drain regions 150 may have an elliptical shape.

In an embodiment, the source/drain regions 150 may include a first source/drain region 150a disposed on the first active region 105a, and a second source/drain region 150b disposed on the second active region 105b. The first source/drain region 150a and second source/drain region 150b may include different types of conductivity and/or concentrations of impurities. For example, the first source/drain region 150a may have the second conductivity type, and the second source/drain region 150b may have the first conductivity type. For example, the first source/drain region 150a and the first active region 105a may have different conductivity types.

The gate structures 160 may be disposed to intersect the active regions 105 and the channel layers 140 on the active regions 105. The channel layers 140 may extend in a direction, for example, in the Y-direction. Channel regions of transistors may be formed in the active regions 105 and/or the channel layers 140 intersecting the gate structures 160.

Each of the gate structures 160 may include a gate dielectric layer 162, a gate electrode 165, a gate spacer 164, and a gate capping layer 166. Upper and lower surfaces of each of the gate structures 160 may contact the channel layers 140. For example, the gate structures 160 may be disposed between the channel layers 140.

According to some embodiments, the gate structures 160 may include a first gate structure 160a and a second gate structure 160b. As shown in FIG. 2C, the first gate structure 160a may intersect the first active region 105a, where the first gate structure 160a extends in a second horizontal direction Y that is perpendicular to a first horizontal direction X, and have a first end portion 160e1 on the second isolation region 107b. The first gate structure 160a may intersect the first active region 105a and the channel layers 140. The first gate structure 160a may surround each of the channel layers 140. The first gate structure 160a may have the first end portion 160e1 on an upper surface of the first separation structure 170.

The second gate structure 160b may intersect the second active region 105b, where the second gate structure 160b extends in the second horizontal direction Y, and may have a second end portion 160e2. The second end portion 160e2 is opposite to the first end portion 160e1 of the first gate structure 160a, and is disposed on the second isolation region 107b. The second gate structure 160b may intersect the second active region 105b and the channel layers 140. The second gate structure 160b may surround each of the channel layers 140. The second gate structure 160b may have the second end portion 160e2 on an upper surface of the first separation structure 170.

The gate dielectric layer 162 may be disposed between each of the active regions 105 and the gate electrode 165. The gate dielectric layer 162 may be disposed between each of the channel layers 140 and the gate electrode 165, and may be disposed to cover at least a portion of surfaces of the gate electrode 165. For example, the gate dielectric layer 162 may be disposed to surround all surfaces of the gate electrode 165 except an uppermost surface of the gate electrode 165. The gate dielectric layer 162 may extend between the gate electrode 165 and the gate spacer 164, but exemplary embodiments are not limited thereto. The gate dielectric layer 162 may include an oxide, a nitride, or a high-K dielectric material. The high-K dielectric material may refer to a dielectric material having a higher dielectric constant than a silicon oxide ($SiO_2$). The high-K dielectric material may be at least one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$). According to some embodiments, the gate dielectric layer 162 may have a multilayer structure.

The gate electrode 165 may be disposed on the active regions 105 to extend upwardly of the channel layers 140 while filling a space between the channel layers 140. The gate electrode 165 may be spaced apart from the channel layers 140 by the gate dielectric layer 162. For example, the gate dielectric layer 162 may be disposed between gate electrode 165 and a channel layer of the plurality of channel layers 140. The gate electrode 165 may include a conductive material, for example, a metal nitride such as titanium nitride (TiN), tantalum nitride (TaN) or tungsten nitride (WN) and/or a metallic material such as aluminum (Al), tungsten (W) or molybdenum (Mo), or a semiconductor material such as doped polysilicon. In some embodiments, the gate electrode 165 may have a multilayer structure including two or more layers. According to the configuration of the semiconductor device 100, the gate electrodes 165 may be separated from each other by an additional separation portion between at least a portion of transistors adjacent to each other. The gate electrode 165 may include different materials depending on transistor regions.

The gate spacer 164 may be disposed on opposite side surfaces of the gate electrode 165 and may extend in a Z-direction, where the Z-direction is perpendicular to the upper surface of the substrate 101. The gate spacer 164 may include a portion of which an upper width is less than a lower width. For example, a width of the uppermost surface of the gate spacer 164 may be less than a width of the lowermost surface of the gate spacer 164. However, a shape of the gate spacer 164 may vary according to some embodiments. The gate spacer 164 may insulate the source/drain regions 150 and the gate electrode 165. The gate spacer 164 may have a multilayer structure according to some embodiments. The gate spacer 164 may be formed by an oxide, a nitride, or an oxynitride.

The gate capping layer 166 may be disposed on the gate electrode 165. The gate capping layer 166 may have a structure that plays a role in protecting the gate electrode 165 from etching in a subsequent process after formation of the gate electrode 165, but the role of the gate capping layer 166 is not limited thereto. The gate capping layer 166 may be disposed on the gate electrode 165 and the gate spacer 164. At least a portion of the lower surface of the gate capping layer 166 may be surrounded by the gate electrode 165 and the gate spacer 164. In an embodiment, the gate capping layer 166 may include a lower surface having a shape, convex toward the substrate 101. The gate capping layer 166 may include a silicon nitride or a silicon nitride-based insulating material.

In an embodiment, the gate structures 160 may include first gate structures 160a and second gate structures 160b separated from each other and opposite to each other in the Y-direction in which the gate structures 160 extend. The first gate structures 160a may be parallel to each other and intersects the first active region 105a, and the second gate structures 160b may be parallel to each other and intersects the second active region 105b. The first gate structures 160a and the second gate structures 160b may have substantially the same width in the X-direction. The first gate structures 160a and the second gate structures 160b may be physically and electrically separated from each other.

According to some embodiments, the semiconductor device 100 may further include internal spacer layers 130 (shown in FIG. 2B) disposed between the channel layers 140, and are parallel to the gate electrode 165. The gate electrode 165, disposed below an uppermost channel layer among the channel layers 140, may be spaced apart from the source/drain regions 150 by the internal spacer layers 130 to be electrically separated from the source/drain regions 150. Each of the internal spacer layers 130 may have a shape in which side surfaces, opposite to the gate electrode 165, are convexly rounded into the gate electrode 165, but the shape of each of the internal spacer layers 130 is not limited thereto. The internal spacer layers 130 may be formed of an oxide, a nitride, and or an oxynitride, for example, a low-K dielectric material. According to some embodiments, the internal spacer layers 130 might not be included.

The contact plugs 171 may penetrate through the interlayer insulating layer 190 (shown in FIG. 2E) to be connected to the source/drain regions 150 and electrically connected to the source/drain regions 150. The contact plug 171 may be disposed on the source/drain region 150. The contact plug 171 may have an inclined side surface of which a lower width is less than an upper width depending on an aspect ratio, but exemplary embodiments are not limited thereto. The contact plug 171 may be disposed to recess the source/drain regions 150 to a predetermined depth. The contact plug 171 may include, for example, a metal nitride (for example, at least one of a titanium nitride (TiN), a tantalum nitride (TaN), or a tungsten nitride (WN)) and a metal material (at least one of aluminum (Al), tungsten (W), or molybdenum (Mo)).

As shown in FIG. 2C, the first separation structure 170 and second separation structure 180 may penetrate through the gate structures 160 and may extend in the first horizontal direction (i.e., X-direction) on the second isolation region 107b. The second isolation region 107b is disposed between the first active region 105a and the second active region 105b.

The first separation structure 170 and second separation structure 180 may include a first separation structure 170, extending into the second isolation region 107b, and a second separation structure 180 penetrating through at least a portion of the first separation structure 170.

As shown in FIG. 2D, the first separation structure 170 may penetrate through at least a portion of the second isolation region 107b. At least a portion of an uppermost portion of the first separation structure 170 may have a convex shape in a direction away from the upper surface of the substrate 101. The first separation structure 170 may include a first region 170_1, vertically overlapping the gate structure 160, and a second region 170_2 vertically overlapping the second separation structure 180. The first separation structure 170 may be disposed between the first gate electrode 165a and second gate electrode 165b.

The second separation structure 180 may be disposed between the first end portion 160e1 of the first gate structure 160a and the second end portion 160e2 of the second gate structure 160b and in contact with the first separation structure 170. The second separation structure 180 may be disposed on a level higher than a level of the second isolation region 107b. The second separation structure 180 may contact the first gate electrode 165a and second gate electrode 165b and may extend into the first separation structure 170. The second separation structure 180 may be disposed between the first end portion 160e1 of the first gate structure 160a and the second end portion 160e2 of the second gate structure 160b to contact the first separation structure 170. A portion of the second separation structure 180 may be disposed between the first region 170_1 of the first separation structure 170.

As illustrated in FIG. 2D, a width L5 of a lower region of the second separation structure 180 in the second horizontal direction (i.e., Y-direction) may be less than a width L4 of an upper region of the first separation structure 170 in the second horizontal direction. An uppermost portion of the first separation structure 170 may be disposed on a level higher than a level of an uppermost portion of the second isolation region 107b (see lowermost region of L3). A lowermost portion of the second separation structure 180 (which is adjacent to the first separation structure 170) may be disposed on a level higher than a level of an upper surface of the second isolation region 107b. The uppermost portion of the first separation structure 170 (see uppermost region of L3) may be disposed on a level lower than a level (shown as uppermost region of L2), and disposed between an upper surface of the second isolation region 107b and an uppermost portion of the uppermost channel layers (shown as uppermost region of L2') among the plurality of channel layers 140. A distance between the upper surface of the first separation structure 170 and the lower surface of the first separation structure 170 may be less than a distance between the upper surface of the second separation structure 180 and the lower surface of the second separation structure 180. For example, the height (measured in the Z-direction) of the first separation structure 170 may be less than the height (measured in the Z-direction) of the second separation structure 180. A distance difference between a first height level of the lower surface of the first gate structure 160a, where the first gate structure 160a vertically overlapping the second isolation region 107b adjacent to the first separation structure 170, and a second height level of the lower surface of the first separation structure 170 may be greater than a distance difference between the first height level of the lower surface of the first gate structure 160a and a third height level of an upper end of the first separation structure 170.

The first separation structure 170 and second separation structure 180 may include at least one of a silicon nitride, a silicon oxide, a silicon oxynitride, or a nitride-based material. The first separation structure 170 and second separation structure 180 may include the same material as the gate spacer 164, but exemplary embodiments are not limited thereto. The first separation structure 170 and the second separation structure 180 may include substantially the same insulating material, but exemplary embodiments are not limited thereto.

The interlayer insulating layer 190 (as shown in FIG. 2E) may be disposed to cover the source/drain regions 150, the gate structures 160, and the isolation region 107. The interlayer insulating layer 190 may include at least one of, for example, an oxide, a nitride, or an oxynitride, and may include a low-K dielectric material.

Figure 3:
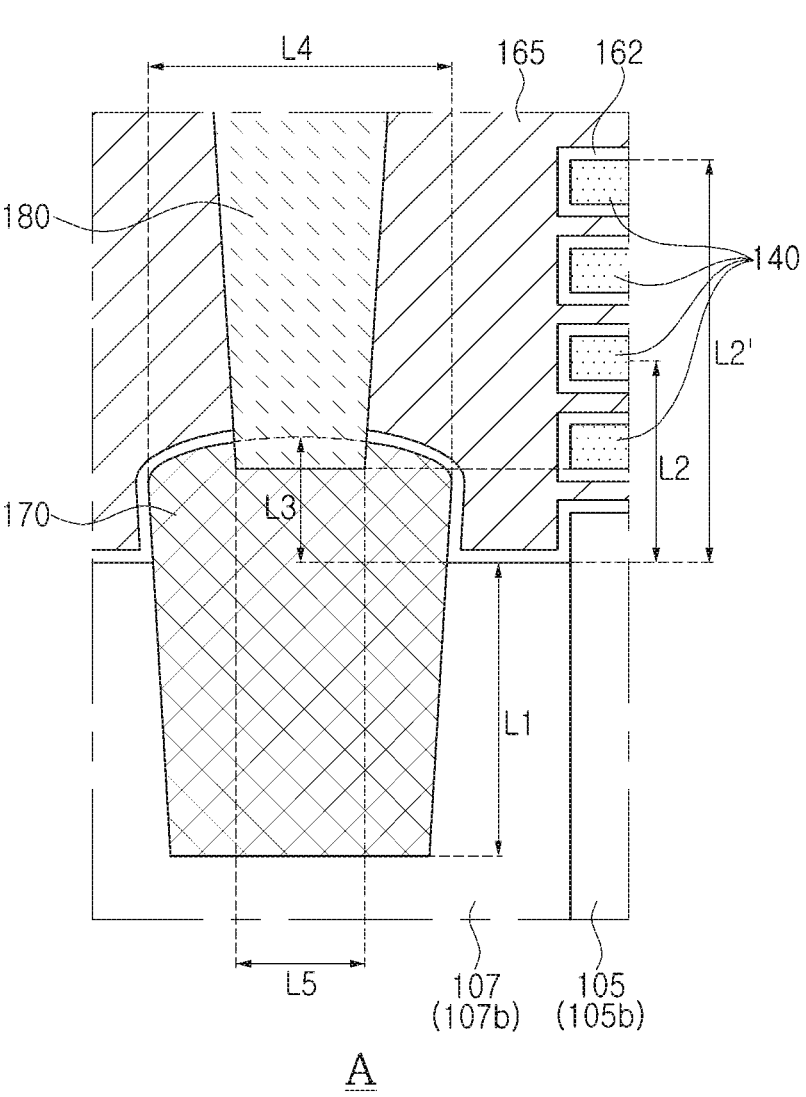
FIG. 3 is a partially enlarged view illustrating a portion of a semiconductor device according to exemplary embodiments.

FIG. 3 is a partially enlarged view illustrating a portion of a semiconductor device according to exemplary embodiments. FIG. 3 illustrates modified embodiments in which a region corresponding to region "A" of FIG. 2C is modified.

Referring to FIG. 3, a semiconductor device 100a according to exemplary embodiments may include a second separation structure 180 having a lowermost portion disposed on substantially the same level as a lower surface of a lowermost channel layer among channel layers 140. However, exemplary embodiments are not limited thereto, and the lowermost portion of the second separation structure 180 may be disposed on a level that is lower than the lower surface of the lowermost channel layer among the channel layers 140 and higher than an upper surface of a second active region 105b.

Figure 4:
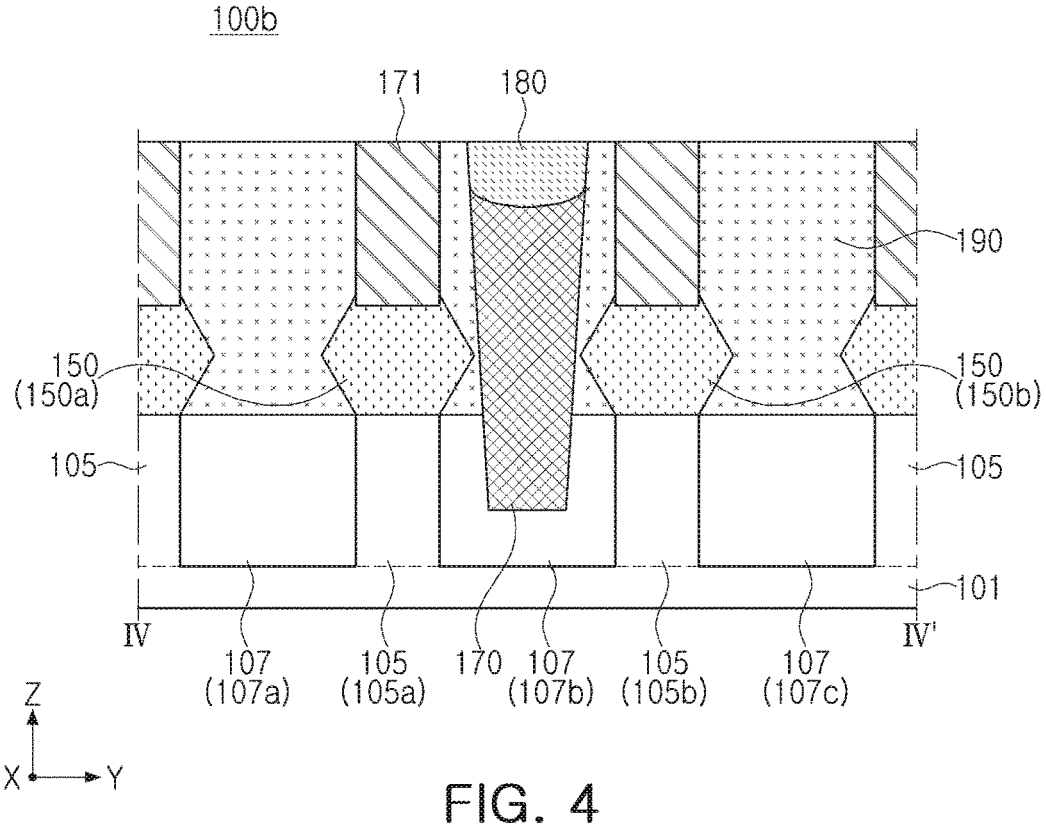
FIG. 4 is a cross-sectional view illustrating a semiconductor device according to exemplary embodiments.

FIG. 4 is a cross-sectional view illustrating a semiconductor device 100b according to exemplary embodiments. FIG. 4 illustrate a region corresponding to a cross-section taken along line IV-IV' of FIG. 1.

Referring to FIG. 4, the semiconductor device 100b may further include a second separation structure 180. In the cross-section taken along IV-IV', the second separation structure 180 may be formed through processes of FIGS. 12 and 13C. After an opening is formed on the first separation structure 170 in the process of FIG. 12, a second preliminary separation structure 180' may be filled in the process of FIG. 13C and a second separation structure 180 may be formed through a planarization process.

Figure 5:
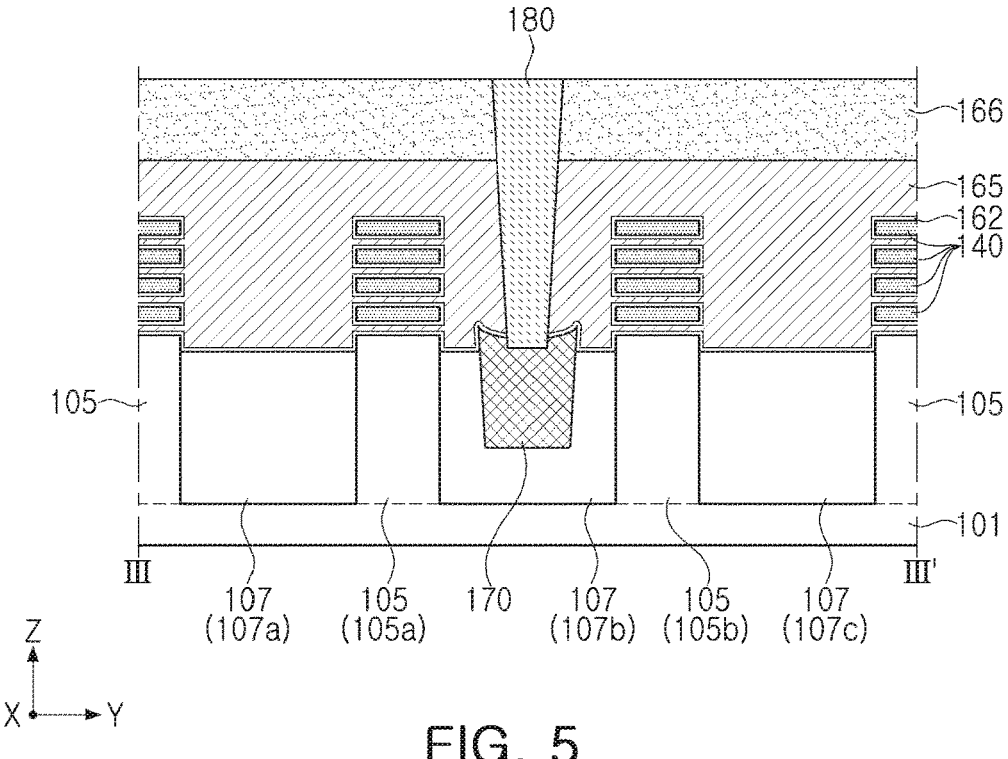
FIG. 5 is a cross-sectional view illustrating a semiconductor device according to exemplary embodiments.

FIG. 5 is a cross-sectional view illustrating a semiconductor device 100c according to exemplary embodiments. FIG. 5 illustrates a region corresponding to a cross-section taken along line III-III' of FIG. 1.

Referring to FIG. 5, the semiconductor device 100c, according to exemplary embodiments, may include a first separation structure 170 having a shape, different from the first separation structure 170 of FIG. 2C. According to an etching process during formation of the first separation structure 170, in FIG. 2C, at least a portion of an uppermost portion of the first separation structure 170 may have an upwardly convex shape in a vertical direction Z, perpendicular to a first horizontal direction X and a second horizontal direction Y. In FIG. 5, at least a portion of an uppermost portion of the first separation structure 170 may have a downwardly convex shape in a vertical direction Z, perpendicular to a first horizontal direction X and a second horizontal direction Y.

Figure 6:
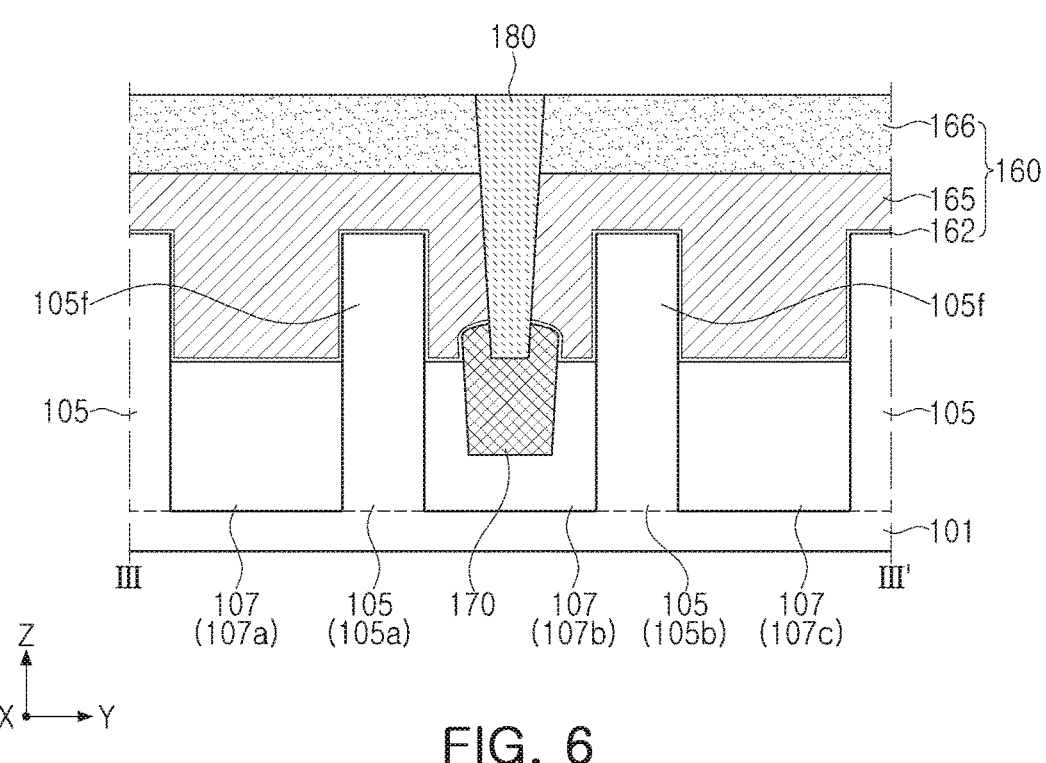
FIG. 6 is a cross-sectional view illustrating a semiconductor device according to exemplary embodiments.

FIG. 6 is a cross-sectional view illustrating a semiconductor device 100d according to exemplary embodiments. FIG. 6 illustrates a region corresponding to a cross-section taken along line III-III' of FIG. 1.

Referring to FIG. 6, a semiconductor device 100d, according to exemplary embodiments, may have a plurality of fin structures disposed on active regions 105 rather than channel layers 140. Accordingly, the semiconductor device 100d may be a fin-type field effect transistor formed by a channel structure, source/drain regions 150, and gate structures 160.

A first active region 105a may include an active fin 105f protruding upward along the Z-direction and penetrating through an isolation region 107, and a second active region 105b may include an active fin 105f protruding upward along the Z-direction and penetrating through the isolation region 107.

The gate structure 160 may extend upwardly of the isolation region 107 and surrounding an upper surface and side surfaces of the active fins 105f of the first active region 105a. Additionally, and the gate structure 160 may extend upwardly of the isolation region 107 and covering an upper surface and side surfaces of the active fin 105f of the first active region 105a.

An uppermost portion of the first separation structure 170 may be disposed on a level lower than a midpoint level between an uppermost portion of the isolation region 107 and an uppermost portion of the active fins 105f. A lowermost portion of the second separation structure 180, penetrating through at least a portion of the first separation structure 170, may be disposed between the uppermost portion of the isolation region 107 and an uppermost portion of the first separation structure 170.

Figure 7:
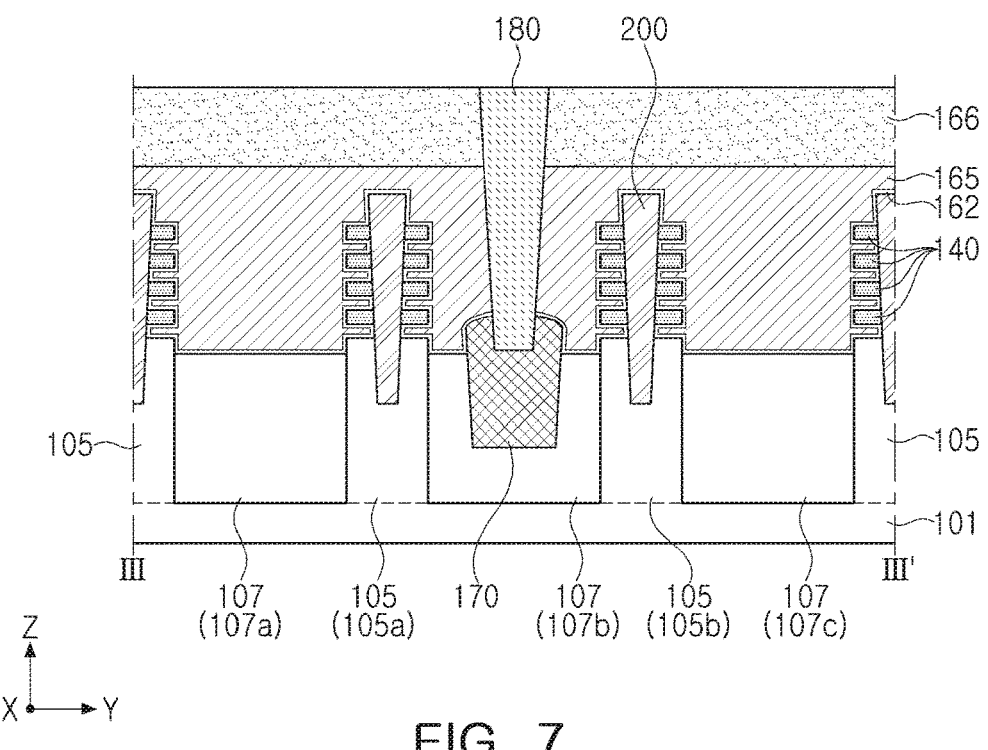
FIG. 7 is a cross-sectional view illustrating a semiconductor device according to exemplary embodiments.

FIG. 7 is a cross-sectional view illustrating a semiconductor device 100e according to exemplary embodiments.

FIG. 7 illustrates a region corresponding to a cross-section taken along line III-III' of FIG. 1.

Referring to FIG. 7, the semiconductor device 100e, according to exemplary embodiments, may further include an insulating structure 200 penetrating through channel layers 140 and at least a portion of active regions 105.

An uppermost portion of the first separation structure 170 may be disposed on a level lower than a midpoint level between an uppermost portion of an isolation region 107 and an uppermost portions of an uppermost channel layers among a plurality of channel layers 140. The gate dielectric layers 162 may be disposed to cover an upper surface and side surfaces of the insulating structure 200, and portions of the channel layers 140. In an embodiment, the gate dielectric layers 162 may cover an upper surface and side surfaces of the insulating structure 200, the channel layers 140, and upper surface and side surfaces of the active regions 105.

Accordingly, the semiconductor device 100e may be a transistor having a forksheet FET structure. The forksheet FET may allow an N-type device and a P-type device to be formed to be close to each other and the gate structures 160 may be physically and electrically coupled to each other. Thus, the amount of gate contacts in a CMOS process may be reduced.

Figure 8:
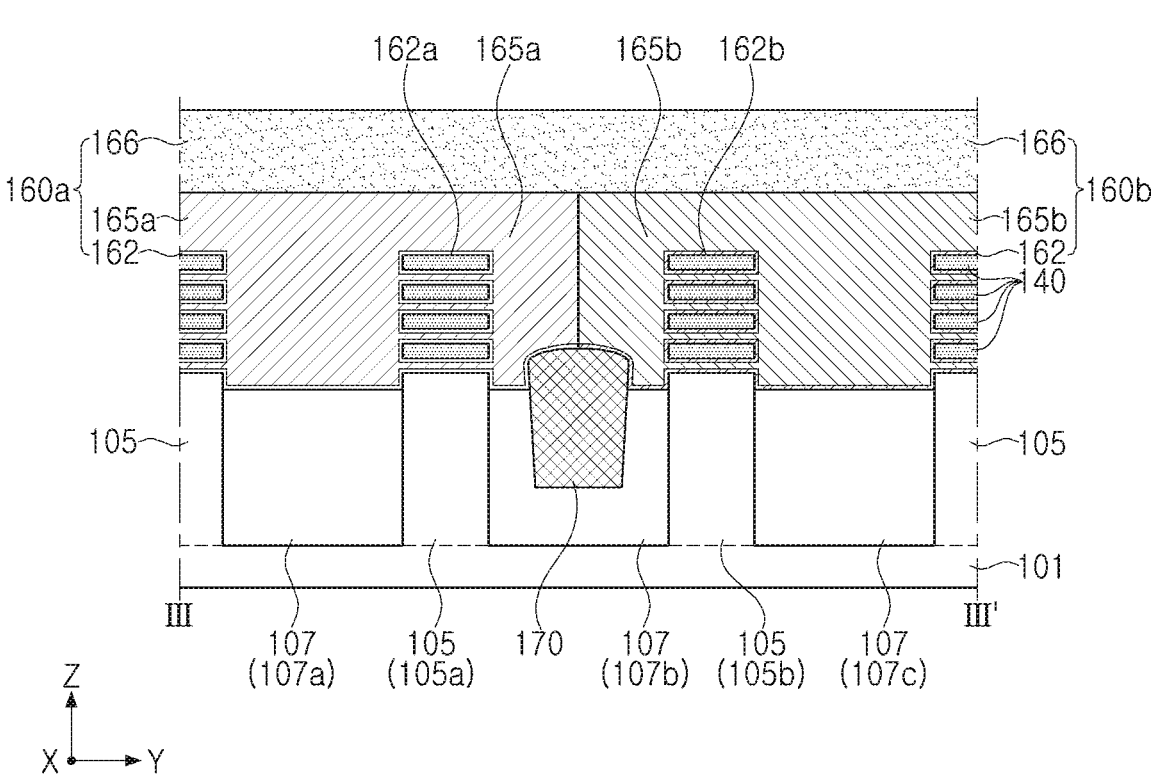
FIG. 8 is a cross-sectional view illustrating a semiconductor device according to exemplary embodiments.

FIG. 8 is a cross-sectional view illustrating a semiconductor device according to exemplary embodiments. FIG. 8 illustrates a region corresponding to a cross-section taken along line III-III' of FIG. 1.

Referring to FIG. 8, the semiconductor device 100f according to exemplary embodiments may not include the second separation structure 180.

The first gate structure 160a may be disposed on the first isolation region 107a and a portion of the second isolation region 107b adjacent to the first active region 105a. The first gate structure 160a may include a first gate dielectric layer 162a and a first gate electrode 165a on the first gate dielectric layer 162a. The first gate dielectric layer 162a may cover an upper portion of the first isolation region 107a, a portion of an upper portion of the second isolation region 107b adjacent to the first active regions 105a, and a portion of an upper portion of the first separation structure 170. The first gate dielectric layer 162a may further cover an upper portion of the first active regions 105a.

The second gate structure 160b may include a second gate dielectric layer 162b disposed on a portion of the second isolation region 107b and a third isolation region 107c, where the second gate dielectric layer 162b may be formed of a material different from a material of the first gate dielectric layer 162a. The second gate electrode 165b may be formed of a material different from a material of the first gate electrode 165a and may be disposed on the second gate dielectric layer 162b. The first gate electrode 165a and the second gate electrode 165b may include materials having different work functions. The second gate dielectric layer 162b may cover an upper portion of the third isolation region 107c, a portion of an upper portion of the second isolation region 107b adjacent to the second active region 105b, and a portion of an upper portion of the first separation structure 170.

The first separation structure 170 may penetrate through at least a portion of the first gate structure 160a and the second gate structure 160b. The first separation structure 170 may penetrate through at least a portion of the second isolation region 107b. The first gate electrode 165a and the second gate electrode 165b may contact each other on the first separation structure 170. For example, first gate electrode 165a and the second gate electrode 165b may contact each other at a midpoint of the first separation structure 170 along the second horizontal direction (i.e., Y-direction), but is not limited thereto. An uppermost portion of the first separation structure 170 may be disposed on a level lower than a midpoint level between the uppermost portion of the second isolation region 107b and the uppermost portions of the uppermost channel layers among the plurality of channel layers 140.

The first gate electrode 165a and the second gate electrode 165b may contact each other on the first separation structure 170. The first gate dielectric layer 162a may include a portion interposed between the first gate electrode 165a and the first separation structure 170. The second gate dielectric layer 162b may include a portion interposed between the second gate electrode 165b and the first separation structure 170.

The semiconductor device 100f may include a first transistor region TR1, in which a first active region 105a, first source/drain regions 150a, and first gate structures 160a are disposed, and second transistor regions TR2 in which the second active region 105b, the second source/drain regions 150b, and the second gate structures 160b are disposed. One of the first transistor region TR1 and second transistor region TR2 may be an NMOS transistor region, and the other transistor region may be a PMOS transistor region. Each of the first transistor region TR1 and second transistor region TR2 may include a transistor having a structure of a multi-bridge channel FET (MBCFET™), a FinFET, a forksheet, or the like. A boundary between the first transistor region TR1 and second transistor region TR2 may be distinct by the first separation structure 170.

Figure 11A:
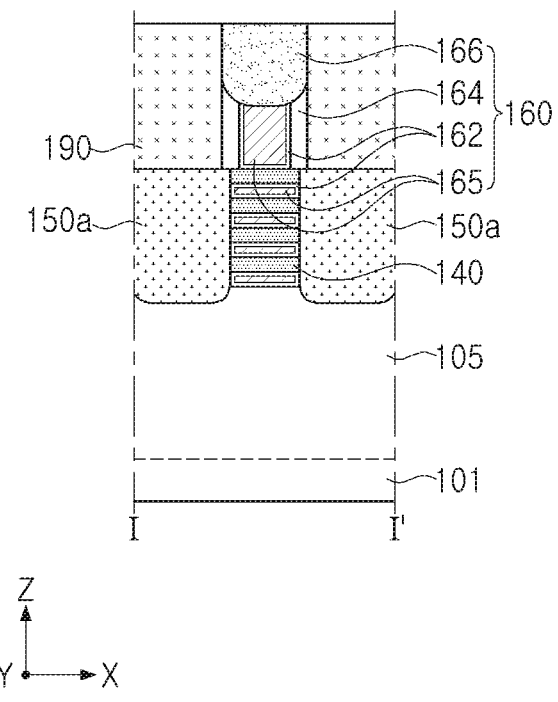
Figure 11B:
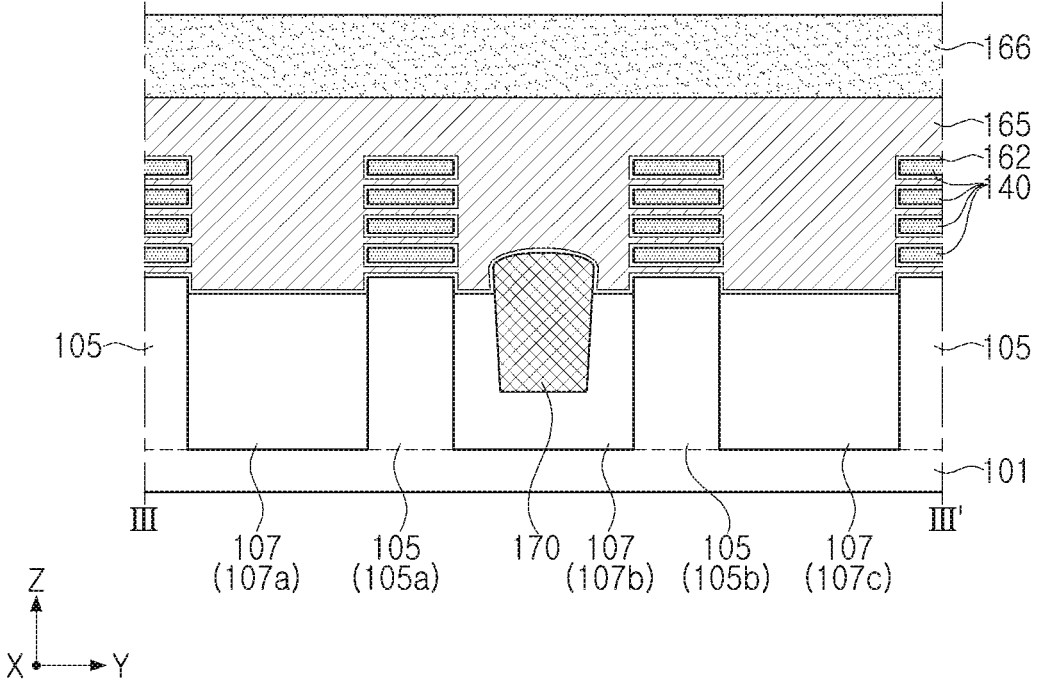
Figure 12:
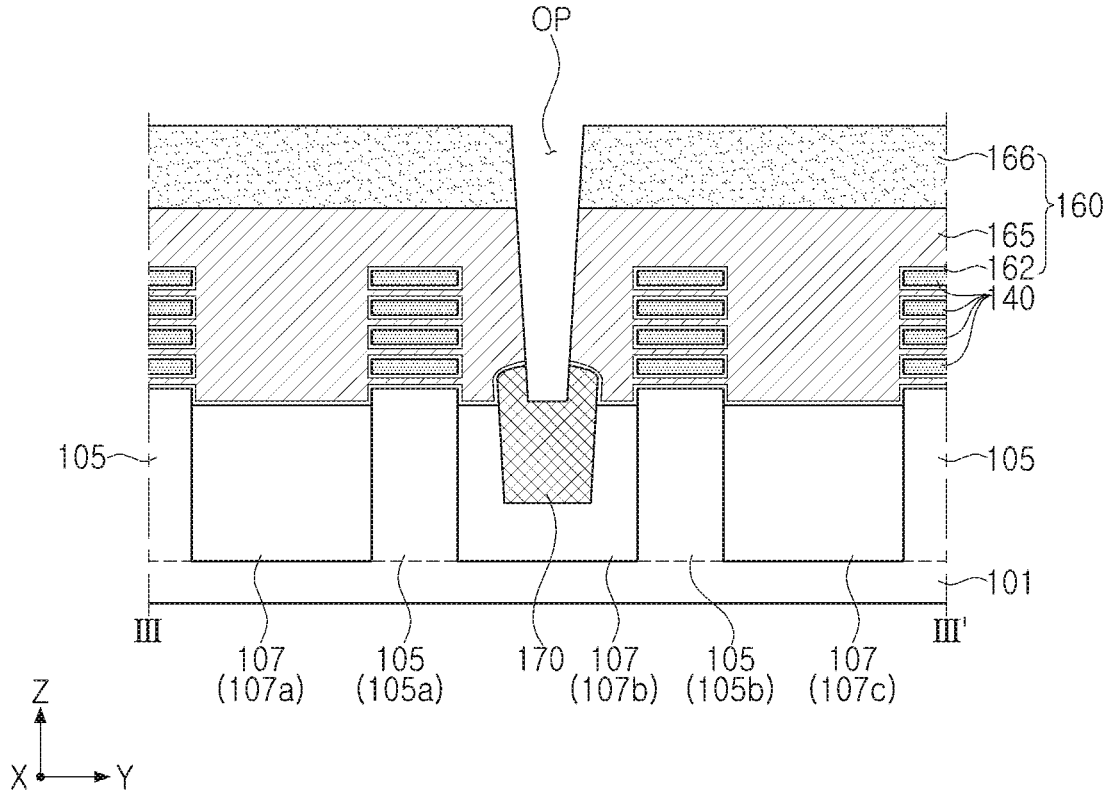
Figure 13A:
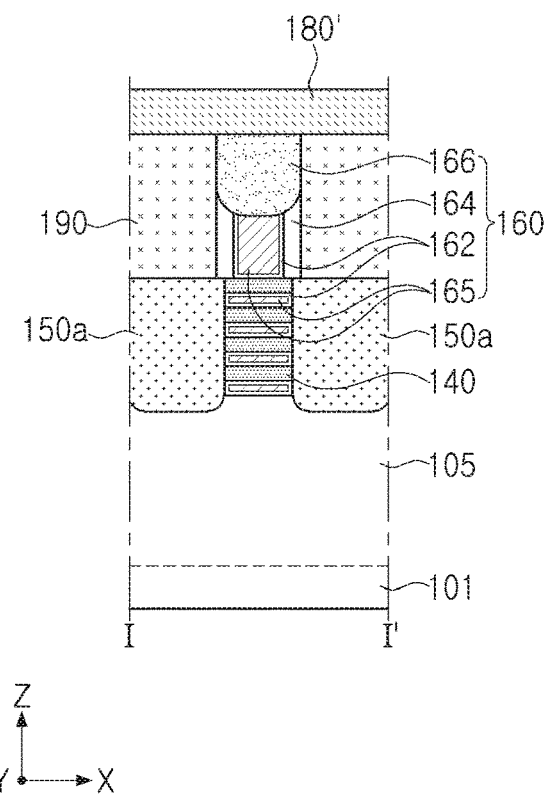
Figure 13B:
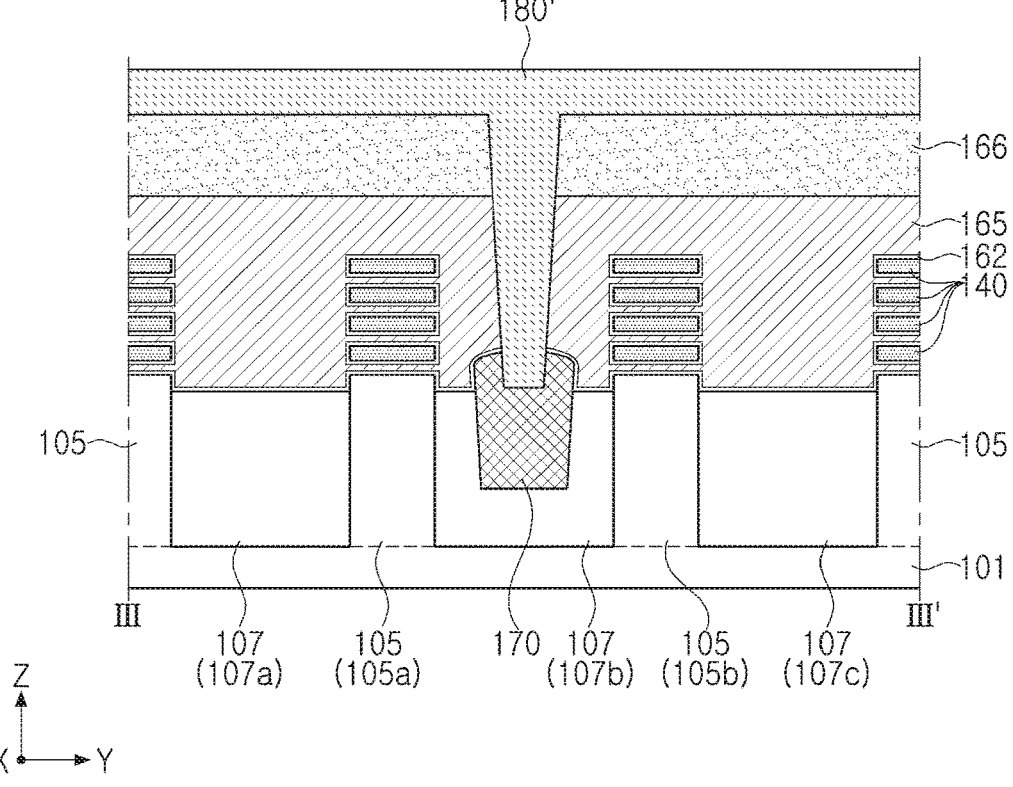
Figure 13C:
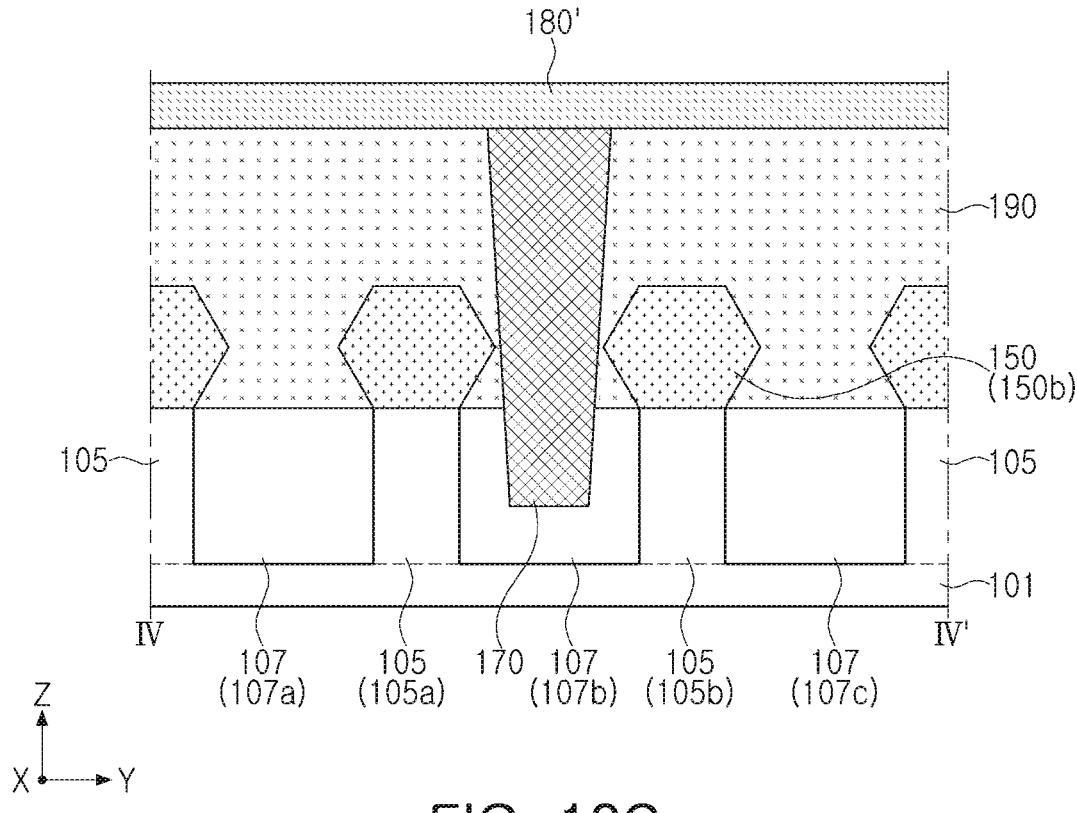

FIGS. 9A to 13C are cross-sectional views illustrating a method of fabricating a semiconductor device according to exemplary embodiments. In FIGS. 9A to 13C, an example of a manufacturing method of fabricating the semiconductor device 100 of FIGS. 1A to 2E will be described. FIGS. 9A, 10A, 11A, and 13A illustrate cross-sections corresponding to FIG. 2A, FIGS. 9B, 10B, 11B, 12, and 13B illustrate cross-sections corresponding to FIG. 2C, and FIGS. 9C and 13C illustrate cross-sections corresponding to FIG. 2E. Among the cross-sections corresponding to FIGS. 2A, 2C, and 2E, overlapping cross-sections are omitted while performing processes of the semiconductor device 100.

Figure 9A:
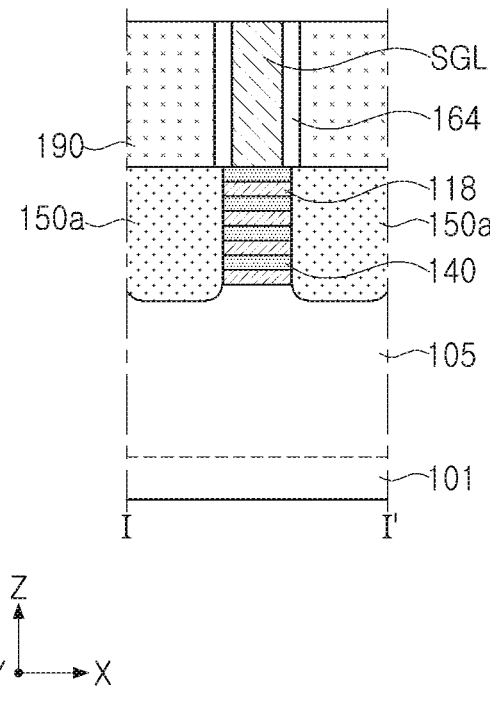
FIGS. 9A, 9B, 9C, 10A, 10B, 11A, 11B, 12, 13A, 13B and 13C are cross-sectional views illustrating a method of fabricating a semiconductor device according to exemplary embodiments.
Figure 9B:
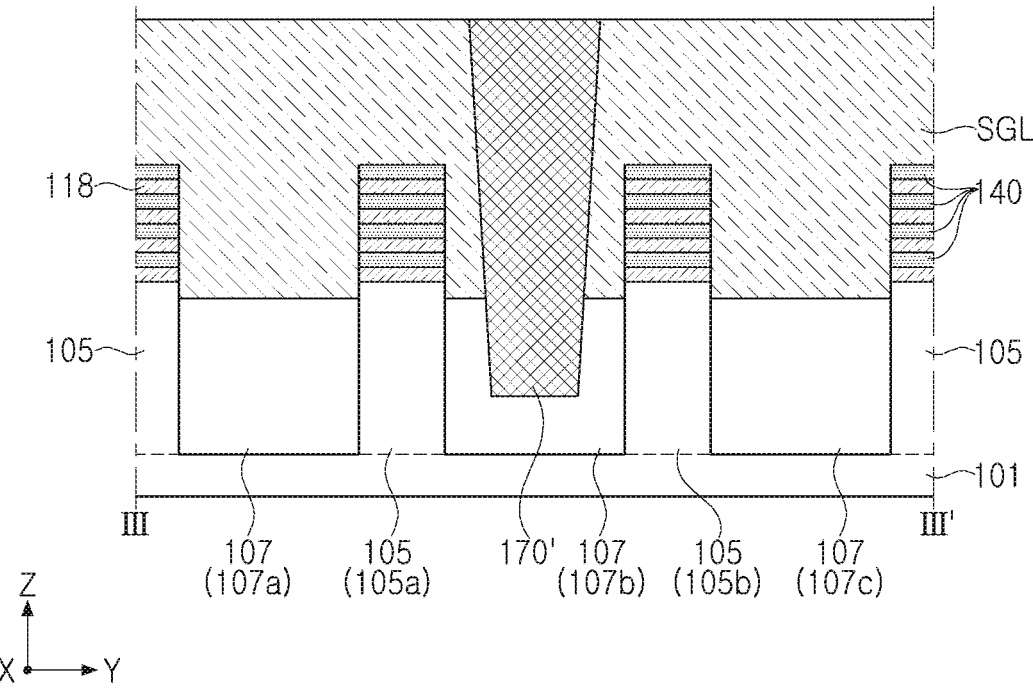
Figure 9C:
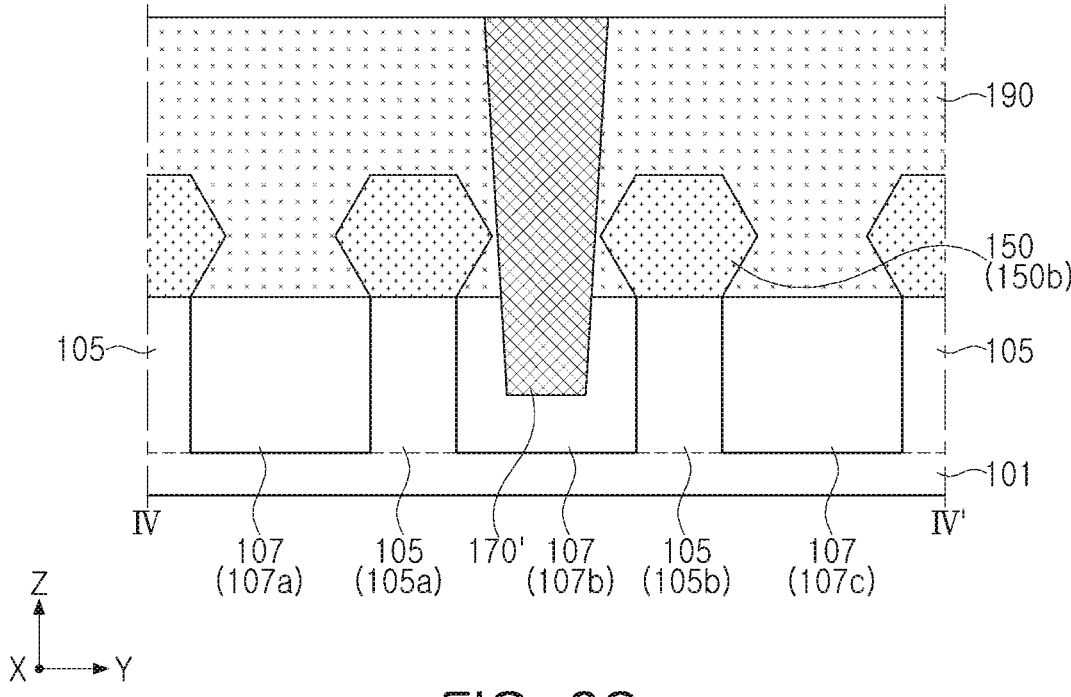

Referring to FIGS. 9A to 9C, active structures 105, 118, and 140 may be formed on a substrate 101, sacrificial gate structures SG and a gate spacer 164 may be formed to intersect the active structures 105, 118, and 140. Active structures 105, 115, and 140 may be referring to active regions 140, sacrificial layers 118, and channel layers 140. Portions of the sacrificial layers 118 and the channel layers 140 may be etched using the sacrificial gate structures SG and the gate spacer 164 as etching masks to expose active regions 105. Source/drain regions 150 (including first source/drain regions 150a and second source/drain regions 150b) may be formed on the exposed active regions 105. An interlayer insulating layer 190 may be formed. Then, a first separation structure 170 may be formed.

The active structures 105, 118, and 140 may be formed by forming sacrificial layers 118 and channel layers 140 to be alternatively stacked on a substrate 101, and etching the alternately stacked sacrificial layers 118 and channel layers 140 and at least a portion of the substrate 101 to form trenches defining the active regions 105. The active structures 105, 118, and 140 may include active regions 105. additionally, sacrificial layers 118 and channel layers 140 are alternately stacked on the active regions 105.

The sacrificial layers 118 and the channel layers 140 may be formed by an epitaxial growth process. The sacrificial layers 118 may be replaced with the gate dielectric layer 162 and the gate electrode 165 through a subsequent process, as illustrated in FIG. 2A. The sacrificial layers 118 may be formed of a material having etch selectivity with respect to the channel layers 140. The sacrificial layers 118 and the channel layers 140 include a semiconductor material including at least one of, for example, silicon (Si), silicon-germanium (SiGe), or germanium (Ge), but may include different materials. For example, the sacrificial layers 118 may include silicon-germanium (SiGe) and the channel layers 140 may include silicon (Si). In an exemplary embodiment, the channel layers 140 may include four layers stacked each with substantially the same thickness. However, exemplary embodiments are not limited thereto and the number and thickness of the channel layers may vary according to exemplary embodiments.

The active regions 105 may be regions defined by the trench. The active regions 105 may be regions formed by removing portions of the substrate 101 so that the active regions 105 protrude from an upper surface of the substrate 101. The active regions 105 may protrude from the substrate 101 in a Z-direction, a vertical direction, and may be formed of the same material as the substrate 101. The active regions 105 may be formed in a line shape extending in one direction, for example, an X-direction, and may be spaced apart from each other in a Y-direction.

In an embodiment, the active structures 105, 118, and 140 may include a first active structure and a second active structure spaced apart from each other in the Y-direction. The first active structure may include a first active region 105a, and first sacrificial layers and first channel layers stacked alternately on the first active region 105a. The second active structure may include a second active region 105b, and second sacrificial layers and second channel layers stacked alternately on the second active region 105b. The first active region 105a and the second active region 105b may have different conductivity types. In an exemplary embodiment, the first active region 105a may have N-type conductivity and the second active region 105b may have P-type conductivity.

In a region in which a portion of the substrate 101 is removed, an isolation region 107 may be formed by disposing an insulating material and removing a portion of the insulating material such that the level of upper surface of the active regions 105 is higher than the level of an upper surface of the removed insulating material. The isolation region 107 may be formed to cover a portion of side surfaces of the active regions 105. An upper surface of the isolation region 107 may be formed to be lower than an upper surface of the active regions 105. The isolation region 107 may include a silicon oxide.

Then, sacrificial gate structures SG may be formed across the active structures 105, 118, and 140, where the sacrificial gate structures SG are parallel to each other. Each of the sacrificial gate structures SG may have a line shape extending in one direction, for example, the Y-direction. The sacrificial gate structures SG may be sacrificial structures formed in a region in which the gate dielectric layer 162 and the gate electrode 165 are disposed above the channel layers 140 through a subsequent process, as illustrated in FIG. 2A. The sacrificial gate structures SG may include a sacrificial gate layer SGL. The sacrificial gate layer SGL may be formed of, for example, polysilicon.

Then, gate spacers 164 may be formed on opposite sidewalls of the sacrificial gate structures SG. The gate spacer 164 may be formed by forming a layer having a uniform thickness along upper surfaces and side surfaces of the sacrificial gate structures SG and the active structures 105, 118, and 140, and anisotropically etching the layer. The gate spacer 164 may include at least one of an insulating material, for example, SiO, SiN, SiCN, SiOC, SiON, or SiOCN. In the present disclosure, the sacrificial gate structures SG and the gate spacer 164 may be referred to as a preliminary gate structure.

Then, the exposed sacrificial layers 118 and the channel layers 140 may be removed between the sacrificial gate structures SG to form a recess portion and to expose the active regions 105. A portion of the substrate 101 may be recessed by forming the recess portion. However, exemplary embodiments are not limited thereto and the recess portion may be recessed such that a lower surface thereof contacts the substrate 101.

In the present operation, portions of the side surfaces of the sacrificial layers 118 exposed by the recess portion may be further removed. The sacrificial layers exposed by the recess portion may be selectively etched with respect to the channel layers 140 by, for example, a wet etching process to be partially removed from side surfaces thereof in the X-direction. Then, internal spacer layers may be formed in a region in which portions of side surfaces of the sacrificial layers 118 are removed. The internal spacer layers may include at least one of SiN, SiCN, SiOCN, SiBCN, or SiBN. The internal spacer layers may be formed of the same material as the gate spacer 164, but exemplary embodiments are not limited thereto. However, according to some embodiments, an operation of removing a portion of the sacrificial layers 118 and an operation of forming the internal spacer layers may be omitted.

Then, source/drain regions 150 may be formed on the active regions 105 on at least one side of the sacrificial gate structures SG and the gate spacer 164. The source/drain regions 150 may be formed by performing an epitaxial growth process within the recessed portion. The source/drain regions 150 may include impurities by, for example, in-situ doping.

Then, an interlayer insulating layer 190 may be formed by planarizing an insulating material to cover the sacrificial gate structures SG, the gate spacer 164, the source/drain regions 150, and the isolation region 107. The insulating material may be formed of an oxide, a nitride, an oxynitride, or a low-K dielectric material.

Then, an opening may be formed to penetrate through the sacrificial gate structures SG, the gate spacer 164, and the interlayer insulating layer 190, and a first preliminary separation structure 170' may be formed in the opening. The first preliminary separation structure 170' may be formed by filling the opening with an insulating material. The first preliminary separation structure 170' may include a silicon nitride or a nitride-based material. A planarization process may be performed on the first preliminary separation structure 170'.

Figure 10A:
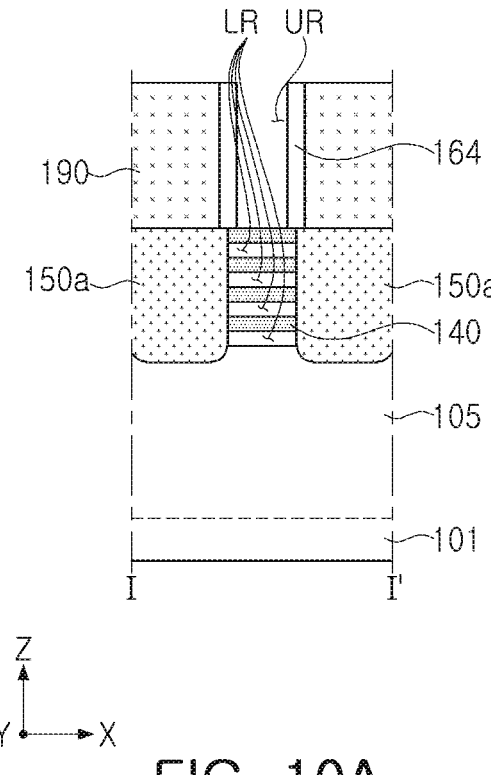
Figure 10B:
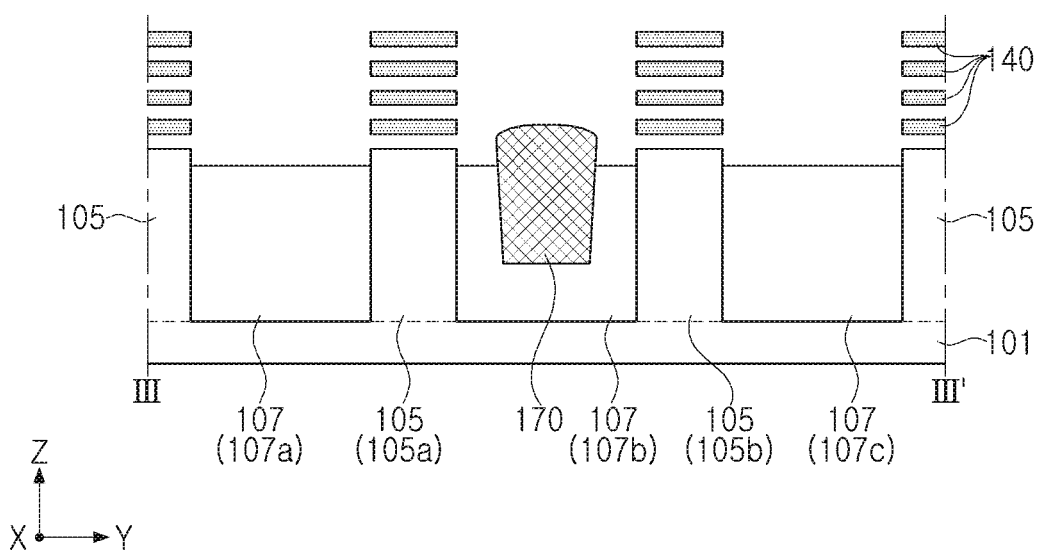

Referring to FIGS. 10A and 10B, a portion of the first preliminary separation structure 170' may be etched to form the first separation structure 170, and the sacrificial layers 118 and sacrificial gate structures SG may then be removed.

By etching the first preliminary separation structure 170', a first separation structure 170 may be formed, where an uppermost portion of the first separation structure 170 is disposed on a level higher than a level of an uppermost portion of the isolation region 107.

Then, the sacrificial layers 118 and the sacrificial gate structures SG may be selectively removed with respect to the gate spacer layers 164, the interlayer insulating layer 190, and the channel layers 140. The sacrificial gate structures SG may be removed to form upper gap regions UR, and the sacrificial layers 118 exposed through the upper gap regions UR may then be removed to form lower gap regions LR. During the removal process, the first and second source/drain regions 150a and 150b may be protected by the interlayer insulating layer 190.

Referring to FIGS. 11A and 11B, gate dielectric layers 162 and a gate electrode 165 may be disposed in the gap regions (e.g., upper gap regions UR and lower gap regions LR) to form gate structures 160.

The gate dielectric layers 162 and the gate electrode 165 may be formed to fill the upper gap regions UR and lower gap regions LR. The gate dielectric layers 162 may be formed to conformally cover internal surfaces of the upper gap regions UR and the lower gap regions LR. The gate electrode 165 may be formed to completely fill the upper gap regions UR and lower gap regions LR. The upper gap regions UR may then be removed to a predetermined depth from above. For example, the gate electrode 165 and the gate dielectric layers 162 may be formed in the upper gap regions UR to a predetermined depth.

The gate dielectric layers 162, the gate electrode 165, and the gate spacer layers 164 may be formed to continuously extend in the Y-direction, and a portion thereof may be removed by an etching process. Then, a gate capping layer 166 may be formed on the gate electrode 165.

Referring to FIG. 12, an opening OP may be formed to penetrate through at least a portion of the gate structures 160 and the first separation structure 170. The opening OP may further penetrate through the interlayer insulating layer 190. For example, the opening OP may penetrate the gate capping layer 166, gate electrode 165, and a portion of the first separation structure 170.

The opening OP may extend into the first separation structure 170 through the gate structures 160 and the interlayer insulating layer 190 to contact the first separation structure 170. A lowermost portion of the opening OP may be disposed on a level higher than a level of an upper surface of the isolation region 107 adjacent to the first separation structure 170. In an exemplary embodiment, the opening OP may have an inclined side surface having a decreased width in a direction toward the substrate 101 based on an aspect ratio, but exemplary embodiments are not limited thereto.

Referring to FIGS. 13A to 13C, a second preliminary separation structure 180' may be formed on the gate structures 160 and the interlayer insulating layer 190. The second preliminary separation structure 180' may be formed in the opening OP. The second preliminary separation structure 180' is formed to cover the gate capping layer 166 and the interlayer insulating layer 190.

The second preliminary separation structure 180' may be formed in the opening OP to separate the gate structures 160 from each other in the Y-direction. In the region, the second preliminary separation structure 180' may be formed to penetrate through the interlayer insulating layers 190 and the first separation structure 170.

Referring to FIGS. 1 to 2E, a second separation structure 180 may be formed by performing a planarization process on the second preliminary separation structure 180'. Contact plugs 171 may be formed to contact the source/drain regions 150 through the interlayer insulating layer 190. As a result, the semiconductor device 100 of FIGS. 1 to 2E may be fabricated.

As described above, a semiconductor device including gate structures and separation structures between end portions of the gate structures may be provided. The separation structures may be disposed between the gate structures, where the separation structures may include first separation structures and a second separation structure. The second separation structure may be disposed on the first separation structure, so that an aspect ratio of the second separation structure may be decreased to reduce difficulty in a process.

According to exemplary embodiments, electrical characteristics of a semiconductor device including a separation structure and a gate structure, according to embodiments of the present inventive concept, may be improved. The separation structure and the gate structure, according to embodiments of the present inventive concept, may be used to provide a semiconductor device having a higher degree of integration.

While exemplary embodiments have been shown and described above, it will be apparent to those skilled in the art that modifications and variations could be made without departing from the scope of the present inventive concept as defined by the appended claims.

What is claimed is:

1. A semiconductor device comprising:
active regions, including a first active region and a second active region parallel to each other, disposed on a substrate and extends in a first horizontal direction;
an isolation region defining the active regions;
a gate structure disposed on the isolation region and extending in a second horizontal direction to intersect an active region; and
a plurality of channel layers spaced apart from each other and disposed on the active region in a vertical direction, perpendicular to the first horizontal direction and the second horizontal direction; and
separation structures penetrating through the gate structure and disposed on the isolation region between the first active region and the second active region,
wherein the separation structures include a first separation structure extending into the isolation region,
wherein an uppermost portion of the first separation structure is disposed on a level higher than a level of an uppermost portion of the isolation region,
and a second separation structure disposed on the first separation structure and penetrating through at least a portion of the first separation structure, the second separation structure having a lowermost portion disposed at a level equal to or lower than a lower surface of a lowermost one of the plurality of channel layers and extending into the first separation structure,
wherein the lowermost portion of the second separation structure is disposed on a level higher than a level of an upper surface of the isolation region adjacent to the first separation structure, and
wherein a width of a lower region of the second separation structure in the second horizontal direction is less than a width of an upper region of the first separation structure in the second horizontal direction.

2. The semiconductor device of claim 1, wherein
a first distance from a first height level of a lower surface of the gate structure, vertically overlapping the isolation region adjacent to the first separation structure, to a second height level of a lower end of the first separation structure is greater than a second distance from the first height level of the lower surface of the gate structure to a third height level of an upper end of the first separation structure.

3. The semiconductor device of claim 1, wherein the plurality of channel layers contacts source/drain regions, and

wherein the uppermost portion of the first separation
structure is disposed on a level lower than a midpoint
level between the upper surface of the isolation region
and an upper surface of an uppermost channel layer
among the plurality of channel layers.
4. The semiconductor device of claim 3, further compris-
ing:
an insulating structure penetrating through the plurality of
channel layers and at least a portion of the active
regions.
5. The semiconductor device of claim 1, wherein
the first separation structure and the second separation
structure include substantially a same insulating mate-
rial.
6. The semiconductor device of claim 1, wherein
the first separation structure and the second separation
structure include different insulating materials.
7. The semiconductor device of claim 1, wherein
the first separation structure includes a first region verti-
cally overlapping the gate structure and a second region
vertically overlapping the second separation structure.
8. The semiconductor device of claim 1, wherein
the gate structure includes a gate dielectric layer and a
gate electrode disposed on the gate dielectric layer.
9. The semiconductor device of claim 8, wherein
at least a portion of a side surface of the second separation
structure contacts the gate electrode.
10. A semiconductor device comprising:
active regions, including a first active region and a second
active region parallel to each other, disposed on a
substrate and extends in a first horizontal direction;
an isolation region between the first active region and the
second active region;
a first gate structure intersecting the first active region,
extending in a second horizontal direction perpendicu-
lar to the first horizontal direction, and having a first
end portion disposed on the isolation region;
a second gate structure intersecting the second active
region, extending in the second horizontal direction,
and having a second end portion opposite from the first
end portion of the first gate structure disposed on the
isolation region;
a first separation structure vertically penetrating through
at least a portion of the isolation region;
wherein an uppermost portion of the first separation
structure is disposed on a level higher than a level of an
upper surface of the isolation region; and
a second separation structure disposed between the first
end portion of the first gate structure and the second end
portion of the second gate structure and contacting the
first separation structure, the second separation struc-
ture having a lowermost portion disposed at a level
equal to or lower than a lower surface of a lowermost
one of a plurality of channel layers and extending into
the first separation structure,
wherein the lowermost portion of the second separation
structure is disposed on a level higher than a level of an
upper surface of the isolation region adjacent to the first
separation structure,
wherein the first gate structure includes a first gate dielec-
tric layer and a first gate electrode disposed on the first
gate dielectric layer,
wherein the second gate structure includes a second gate
dielectric layer and a second gate electrode disposed on
the second gate dielectric layer,
wherein a maximum width of the second separation
structure in the second horizontal direction is less than a minimum width of the first separation structure in the
second horizontal direction,
wherein the first separation structure is spaced apart from
the first gate electrode and the second gate electrode,
and
wherein the second separation structure contacts the first
gate electrode and the second gate electrode.
11. The semiconductor device of claim 10, wherein
a first distance between an upper surface of the first
separation structure and a lower surface of the first
separation structure is less than a second distance
between an upper surface of the second separation
structure and a lower surface of the second separation
structure.
12. The semiconductor device of claim 10, wherein
at least a portion of an upper surface of the first separation
structure has a convex shape in a direction away from
an upper surface of the substrate.
13. The semiconductor device of claim 10, wherein
at least a portion of an upper surface of the first separation
structure has a convex shape in a direction toward an
upper surface of the substrate.
14. A semiconductor device comprising:
active regions, including a first active region and a second
active region parallel to each other, disposed on a
substrate and extends in a first horizontal direction;
an isolation region between the first active region and the
second active region;
a first separation structure vertically penetrating through
at least a portion of the isolation region;
wherein an uppermost portion of the first separation
structure is disposed on a level higher than a level of an
upper surface of the isolation region;
first channel layers spaced apart from each other in a
vertical direction, perpendicular to an upper surface of
the substrate, disposed on the first active region;
second channel layers spaced apart from each other in the
vertical direction disposed on the second active region;
a second separation structure having a lowermost portion
disposed at a level equal to or lower than a lower
surface of a lowermost one of the first channel layers
and the second channel layers and extending into the
first separation structure;
wherein the lowermost portion of the second separation
structure is disposed on a level higher than a level of an
upper surface of the isolation region adjacent to the first
separation structure;
a first gate structure intersecting the first active region and
the first channel layers, surrounding each of the first
channel layers, extending in a second horizontal direc-
tion perpendicular to the first horizontal direction, and
having a first end portion disposed on an upper surface
of the first separation structure; and
a second gate structure intersecting the second active
region and the second channel layers, surrounding each
of the second channel layers, extending in the second
horizontal direction, and having a second end portion
disposed on an upper surface of the first separation
structure,
wherein the first gate structure includes a first gate dielec-
tric layer and a first gate electrode disposed on the first
gate dielectric layer, and
wherein the second gate structure includes a second gate
dielectric layer and a second gate electrode disposed on
the second gate dielectric layer.

15. The semiconductor device of claim 14, wherein
the first gate electrode and the second gate electrode contact each other on the first separation structure,
wherein the first gate dielectric layer includes a portion interposed between the first gate electrode and the first separation structure, and
wherein the second gate dielectric layer includes a portion interposed between the second gate electrode and the first separation structure.

16. The semiconductor device of claim 14, further comprising:
the second separation structure disposed between the first end portion of the first gate structure and the second end portion of the second gate structure and contacts the first separation structure.

\* \* \* \* \*